United States Patent [19]

Matsuoka et al.

[11] Patent Number: 5,078,610
[45] Date of Patent: Jan. 7, 1992

[54] IC SOCKET

[75] Inventors: Noriyuki Matsuoka; Kazumi Uratsuji, both of Tokyo, Japan

[73] Assignee: Yamaichi Electric Mfg. Co., Ltd., Tokyo, Japan

[21] Appl. No.: 599,392

[22] Filed: Oct. 19, 1990

[30] Foreign Application Priority Data

Oct. 30, 1989 [JP] Japan .................. 1-12780[U]

[51] Int. Cl.⁵ .................................. H01R 9/09
[52] U.S. Cl. ........................... 439/70; 439/525
[58] Field of Search ............... 439/62, 68, 70, 72, 439/73, 330, 83, 331, 525, 741

[56] References Cited

U.S. PATENT DOCUMENTS

| | | | |
|---|---|---|---|
| 3,530,422 | 9/1970 | Goodman | 439/741 X |
| 4,035,046 | 7/1977 | Kloth | 439/331 X |
| 4,359,252 | 11/1982 | Olsson et al. | 439/331 X |
| 4,417,777 | 11/1983 | Bamford | 439/70 |

Primary Examiner—Neil Abrams
Assistant Examiner—Khiem Nguyen
Attorney, Agent, or Firm—Wenderoth, Lind & Ponack

[57] ABSTRACT

An IC socket is provided with an inset bottom formed in a socket board at a region from where a group of male terminals project The IC socket has terminal partition walls arranged in a lattice shape and adapted to partition the interior of the inset bottom. A group of grooves are formed between the adjacent terminal partition walls, and the group of male terminals projects from bottom walls of the grooves.

4 Claims, 5 Drawing Sheets

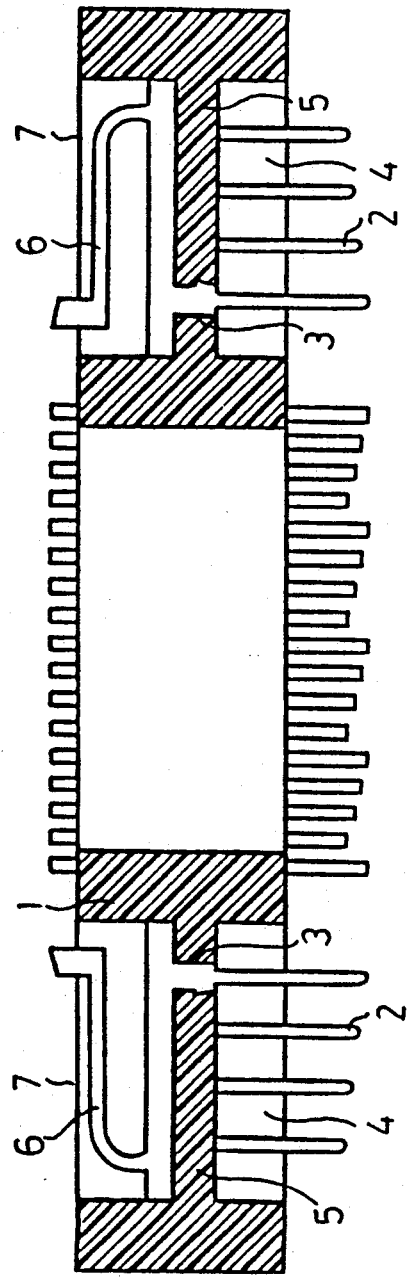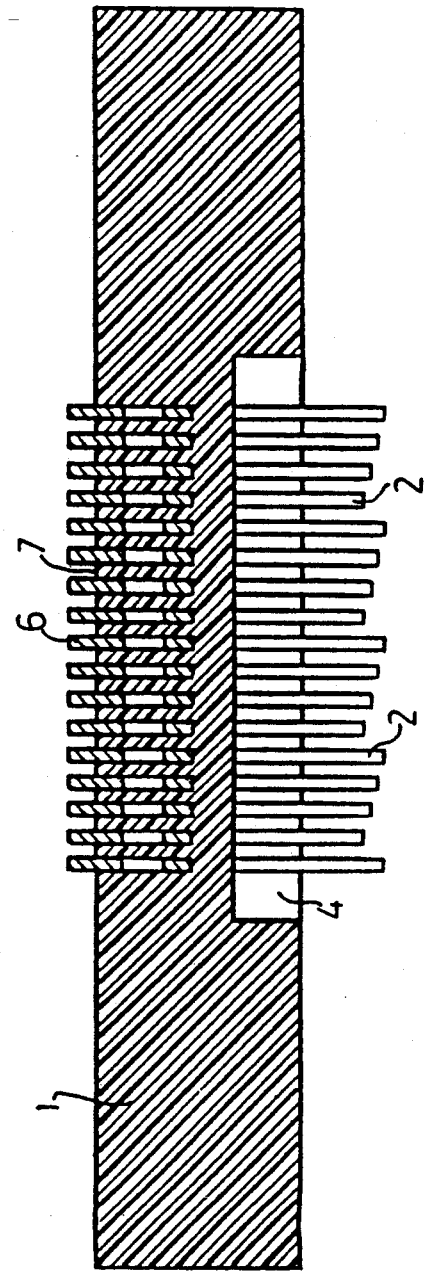

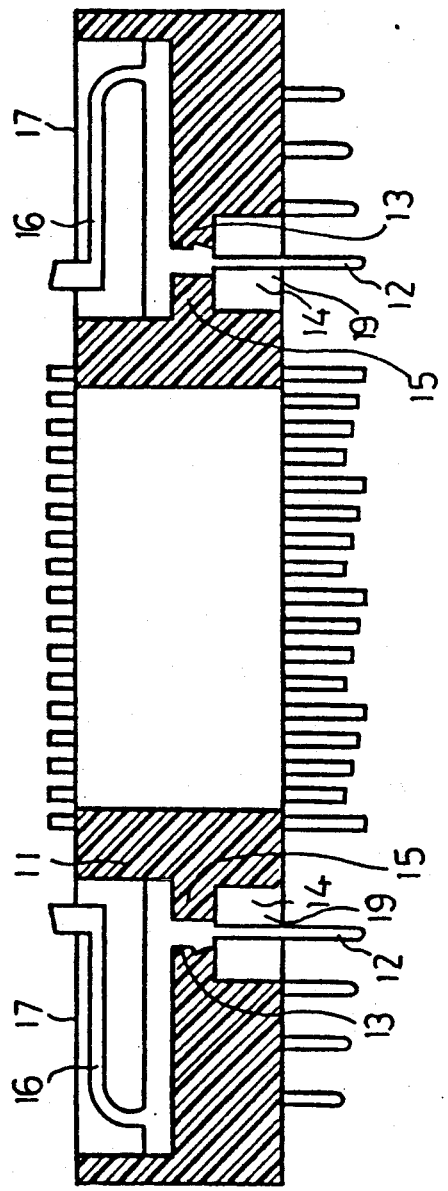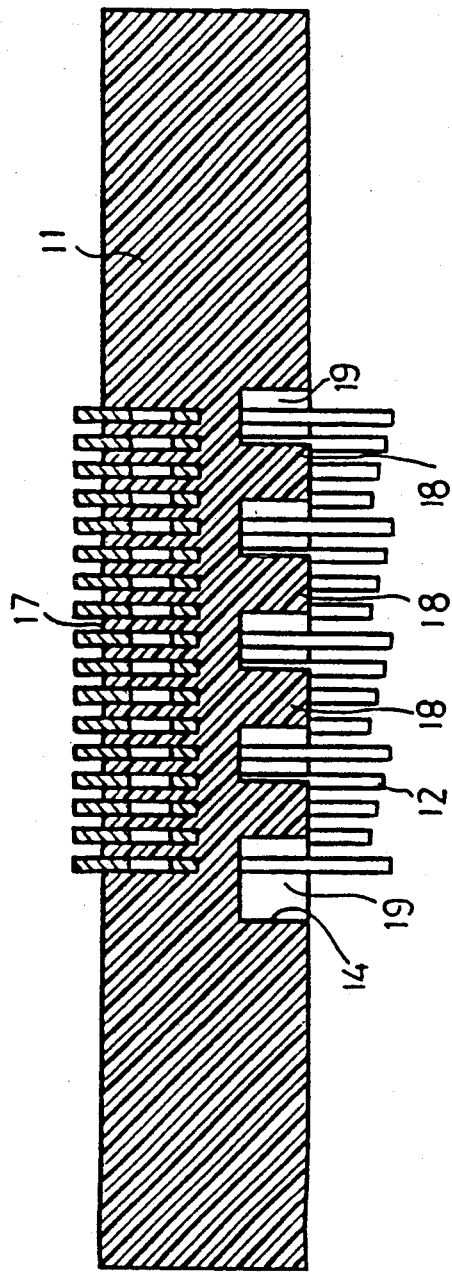

IC SOCKET

BACKGROUND OF THE INVENTION

1. Field of the Invention

This invention relates to an IC socket having a plurality of contacts for contacting with an IC package, each of the contacts having a male terminal projecting outward.

2. Brief Description of the Prior Art

As is shown in FIGS. 1 through 4, a metallic mold used for molding synthetic resin of a socket board 1 conventionally has a group of pins (not shown) for shaping grooves 3 for implanting therein the male terminals 2. For the purpose of shortening the lengths of the shaping pins to enhancing the strength thereof, an inset bottom 4 is formed in the region from where a group of male terminals of the socket board 1 project. Contact partition walls 7 in integrally formed with an upper surface of a bottom wall 5 of the inset bottom 4. A contact 6 is disposed between the partition walls 7. The male terminal 2 of the contact 6 is press fitted into the implantation groove 3 so as to project from a lower surface of the bottom wall.

As mentioned above, the conventional device is provided with an inset bottom formed in the socket board at the region from where the group of male terminals project in order to enhance the strength of the shaping pins of the metallic mold for molding the group of grooves for implanting the male terminals. However, because of the foregoing arrangement, another problem arises in that the strength of the body of the socket board is deteriorated. This "lack of strength" problem becomes more and more significant with the progressively higher density of the implantation of the group of male terminals in recent times.

That is, the group of male terminals becomes more and more miniaturized due to the higher density of the implantation. As they become narrower and weaker than the implantation groove shaping pins, it is required to shorten the length of the male terminals in order to enhance the strength. As a result, the male terminal implantation bottom of the in set bottom, from where the group of male terminals project, is required to be formed thinner. Moreover, as the implantation grooves are formed in high density in the male terminal implantation wall of the inset bottom, the deterioration in strength is much enhanced. Thus, an immediate solution is definitely demanded.

Also, in order to supplement the deterioration of the strength, the entire frame portion at the peripheral edge of a socket board is conventionally increased in thickness, or otherwise a reinforcement rib or ribs are formed there. However, this kind of solution invites an increased size of the socket board and this is apparently against the demand for miniaturization of socket boards.

SUMMARY OF THE INVENTION

The present invention has been accomplished in order to solve the above problems inherent in the prior art.

It is therefore an object of the present invention to provide an IC socket capable of effectively solving the above problems without the necessity for making the IC socket large in size and while properly maintaining an inset amount of an inset bottom from where male terminals project.

To achieve the above object, there is essentially provided an IC socket provided with an inset bottom formed in a socket board at a region from where a group of male terminals project, comprising terminal partition walls arranged in a lattice shape and adapted to partition the interior of the inset bottom, and a group of grooves formed between adjacent terminal partition walls, the group of male terminals projecting from bottom walls of said grooves.

From another aspect of the present invention, there is also provided an IC socket having an inset bottom formed in a socket board at a region from where a group of male terminals project, comprising terminal partition walls adapted to partition the interior of the inset bottom, the partition walls being linked relative to each other to form a mesh-like configuration, and grooves defined by the mesh-like terminal partition walls, the group of male terminals projecting from bottom walls of the grooves.

According to the present invention, having the above-mentioned construction, by virtue of the provision of the terminal partition walls for partitioning the inset bottom at a region from where the male terminals project in a lattice shape or the terminal partition walls linked in a mesh-like configuration, it provides substantially the same effect as if the inset bottom were substantially increased in thickness. Moreover, as the above-mentioned effect can be obtained while maintaining a proper inset amount required for forming the implantation grooves for the male terminals, it works very effectively as a means for coping with deterioration of the strength of the socket board caused by the inset bottom.

Furthermore, as the shaping pins for the male terminal implantation grooves can be made short by increasing the the inset amount, it can be of great help for shaping the male terminal implantation grooves in high density.

The above and other objects, characteristic features and advantages of the present invention will become more manifest to those skilled in the art upon reading the following detailed description of the preferred embodiment with reference to the accompanying drawings.

BRIEF DESCRIPTION OF THE DRAWINGS

FIG. 3 is a sectional view taken on line A—A of FIG. 1;
and
FIG. 4 is a sectional view taken on line B—B of FIG. 1.
FIG. 6 is a sectional view taken on line C—C of FIG. 5;
FIG. 7 is a sectional view taken on line D—D of FIG. 5.

DETAILED DESCRIPTION OF THE EMBODIMENT

The embodiments of the present invention will be described with reference to FIGS. 5 through 9 of the accompanying drawings.

Figure 1:
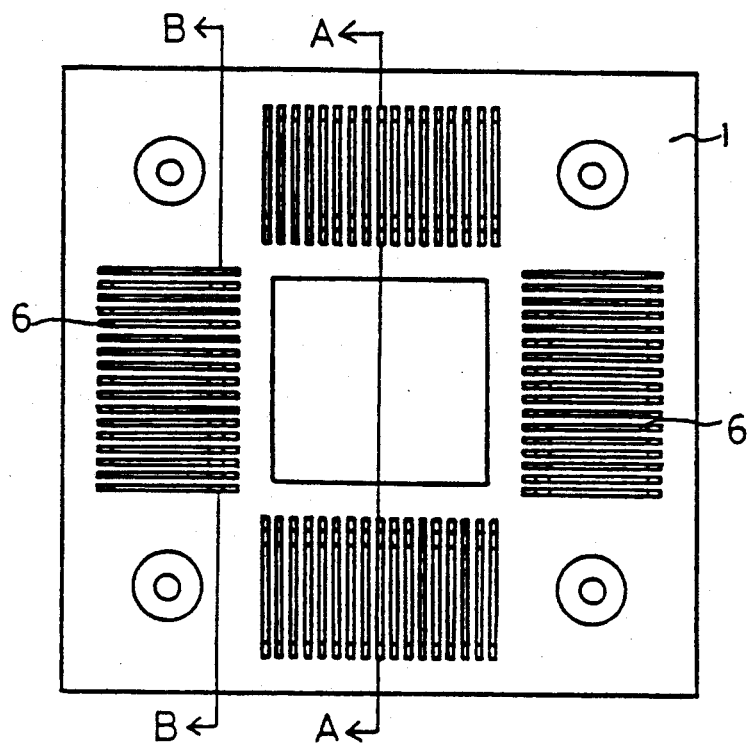
FIG. 1 is a plan view of a conventional socket board.
Figure 2:
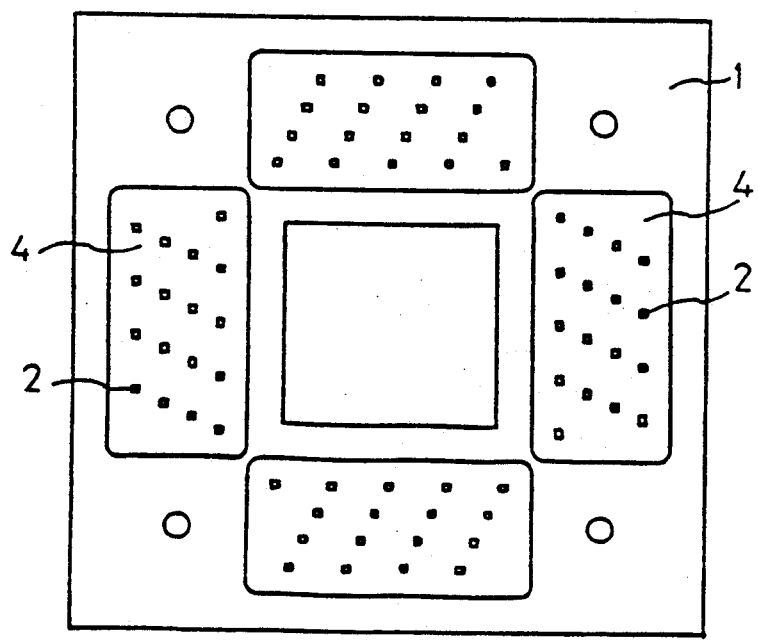
FIG. 2 is a bottom view of FIG. 1.

A socket board 11, as in the prior art of FIG. 1, has a plurality of connector contacts 16 arranged to contact with an IC package.

Each of the connector contacts 16 has a male terminal 12 projecting outward from the socket board 11 so that the male terminal 12 can be connected to a printed circuit board or the like.

The socket board 11 is provided with an inset bottom 14 formed in the socket board 11 at a region from where the male terminals project, the inset bottom 14 being partitioned by a terminal partition wall 18. A group of the male terminals 12 projecting from bottom walls 15 of a group of grooves 19 defined between the terminal partition wall 18 group. A single or plurality of the male terminals 12 are distributed in each groove 19.

The inset bottom 14 is partitioned by the terminal partition wall 18 in a slant lattice (see FIGS. 5 through 7), or in a vertical or horizontal lattice (see FIG. 8), or the terminal partition walls 18 are properly combined so that an elongate groove 19 is formed between adjacent lattice-shaped terminal partition walls 18, and one row portion of the male terminals 12 are distributed in each groove 19, the male terminal group being partitioned by the terminal partition wall 18 per each row and allowed to project downward from the lower surface of the bottom wall 15.

On the other hand, a contact partition wall 17 is integrally formed on the upper surface of the bottom wall 15, the contacts 16 are disposed between adjacent contact partition walls 17, and the male terminals 12 are is implanted, under pressure, into terminal implantation grooves 13 formed in the bottom wall 15 and allowed to project into each groove 19 from the lower surface of the bottom wall 15.

By this, the bottom wall 15 is provided with the contact partition walls 17 integrally formed on the upper surface thereof and with the terminal partition walls 18 integrally formed on the lower surface thereof, both the partition walls 17 and 18 being disposed in such a manner as to intersect with each other. In the embodiment shown in FIGS. 5 through 7, the terminal partition wall 18 is disposed at angles relative to the contact partition wall 17.

Figure 8:
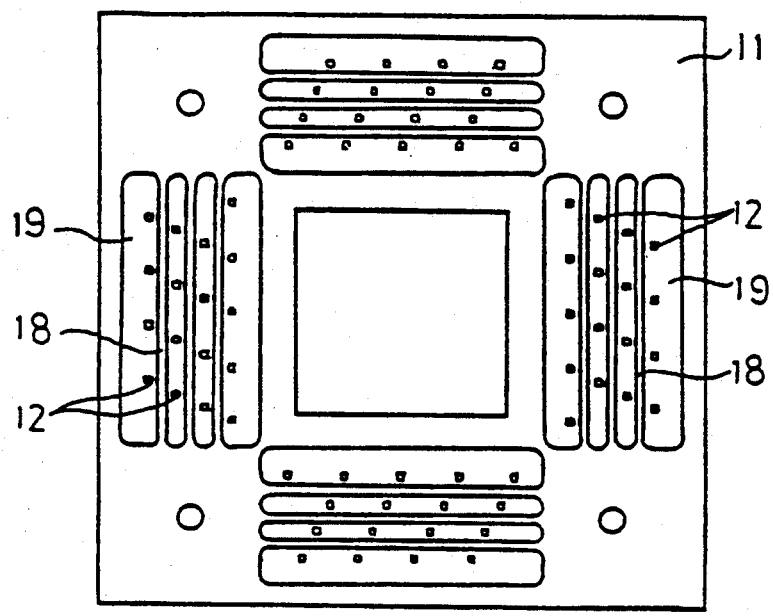
FIG. 8 is a bottom view of a socket board according to another embodiment of the present invention.

In another embodiment shown in FIG.8, the terminal partition walls 18 are disposed in a horizontal lattice shape and are perpendicular to the contact partition walls 17.

Figure 5:
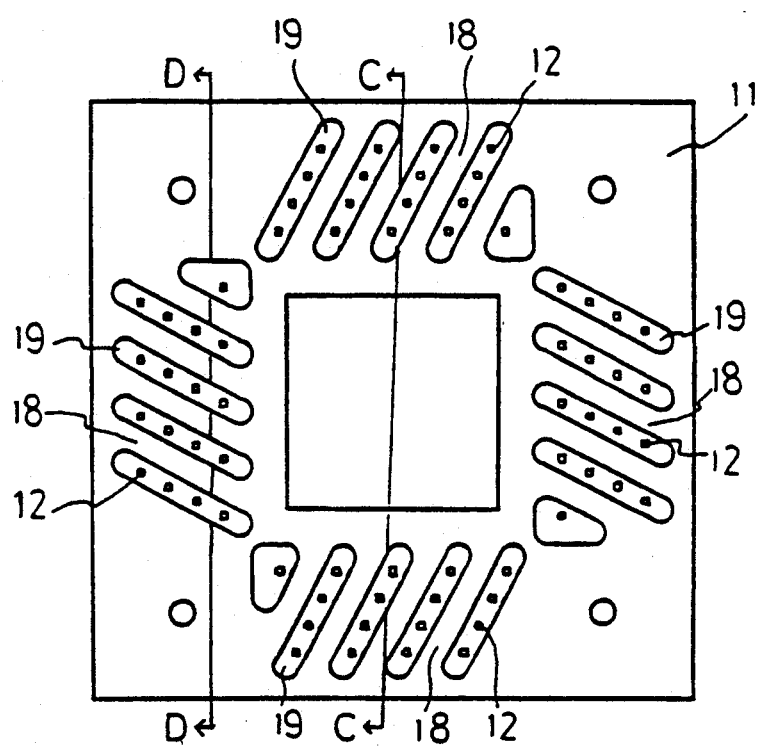
FIG. 5 is a bottom view of a socket board according to one embodiment of the present invention.

In the embodiments shown in FIGS. 5 through 7 and in FIG. 8, two rows or more rows of the male terminals can be disposed in the grooves 19 between the adjacent lattice-shaped terminal partition walls 18. Also, the male terminal group can be divided into a plurality of groups and disposed in each groove in various forms.

Figure 9:
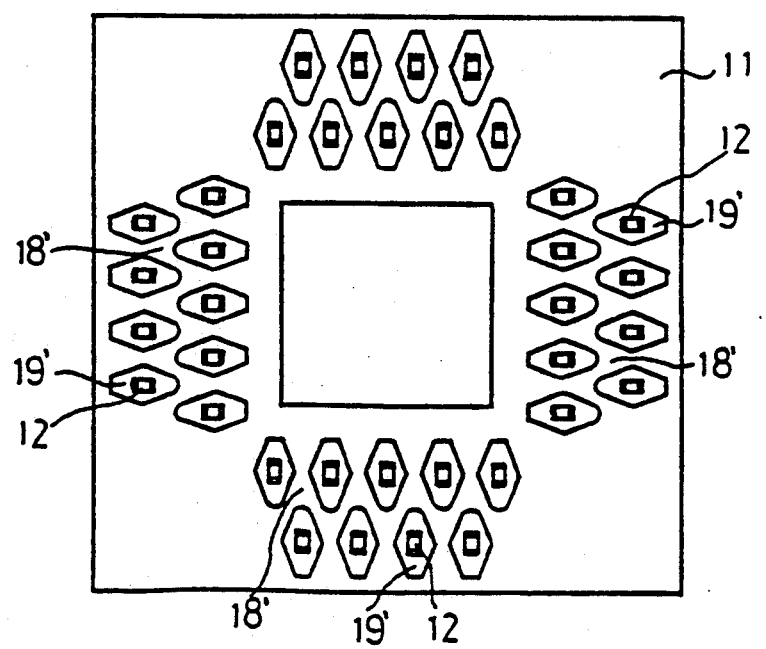
FIG. 9 is a bottom view of a socket board according to a further embodiment of the present invention.

In a further embodiment shown in FIG. 9, the interior of the inset bottom 14 is formed in a partition wall structure linking in a mesh-like configuration and the male terminals 12 are allowed to project from the bottom walls of the grooves 19' defined by the terminal partition wall 18'.

One male terminal 12 is disposed in each of the grooves 19' and the inner portion of each terminal 12 is surrounded by the partition walls 18'.

In this embodiment, as the terminal partition walls 18 are linked in a mesh-like configuration, they intersect with the contact partition walls 17 in various directions.

In any of the above embodiments, the male terminal implantation grooves 13 are formed in the bottom wall 15 of the grooves between the adjacent partition walls by short metallic male terminal shaping pins.

As described in the foregoing, the present invention exhibits substantially the same effect, as the inset bottom is substantially increased in thickness by terminal partition walls partitioning the inset bottom in a lattice shape at a region from where the male terminal group projects or by terminal partition walls linked in a mesh-like configuration, without increasing the size of the IC socket. The foregoing effect can be expected while properly maintaining an inset amount required for forming the male terminal implantation grooves. Thus, this is very effective as a means for coping with the deterioration in strength of the socket board caused by the inset bottom. Also, the lengths of the pins for shaping the male terminal implantation grooves can be shortened by increasing the inset amount of the grooves. Accordingly, this is very advantageous for forming the male terminal implantation grooves in a high density, and can effectively cope with the requirement for forming the male terminals in high density in a an IC socket.

Although the present invention has been herein shown and described in what is conceived to be the most practical and preferred embodiments, it is recognized that departures may be made therefrom within the scope of the present invention, which is not limited to the details disclosed herein but is to be accorded the full scope of the claims so as to embrace any and all equivalent devices and apparatus.

What is claimed is:

1. An IC socket, comprising:
   an IC socket board for the implantation of a group of male contacts terminals;
   an inset portion formed on the bottom of said IC socket board;
   a plurality of contact partition walls on a side of said IC socket board opposite to said inset portion;
   a plurality of terminal partition walls partitioning said inset portion on the bottom of said IC socket;
   a plurality of grooves formed between adjacent said terminal partition walls; and
   terminal grooves extending through said IC socket from between said contact partition walls to said grooves between said terminal partition walls for receipt of implantation male contact terminals;
   wherein in the plane of said IC socket board said terminal partition walls and said contact partition walls are disposed so as to intersect each other.

2. The IC socket of claim 1, wherein said contact partition walls and said terminal partition walls intersect each other at right angles.

3. The IC socket of claim 1, wherein said contact partition walls and said terminal partition walls intersect each other at oblique angles.

4. The IC socket of claim 1, wherein said IC socket board id one piece and molded of synthetid resin.

* * * * *